United States Patent Office 3,736,138

Patented May 29, 1973

3,736,138

PROCESS FOR TRANSFERRING IMAGES FROM A SURFACE TO A TEMPORARY SURFACE AND TO A FINAL SURFACE

Robert Paul Held, Englishtown, N.J., assignor to E. I. du Pont de Nemours and Company, Wilmington, Del.

No Drawing. Filed June 30, 1969, Ser. No. 837,902
Int. Cl. G03c *11/12*
U.S. Cl. 96—28 7 Claims

ABSTRACT OF THE DISCLOSURE

An image-forming process comprising, in order: (1) imagewise exposing photohardenable material to actinic radiation to harden the exposed areas only, (2) transferring the underexposed areas to a transfer sheet by applying pressure thereto at a temperature at which there is cohesive failure of the underexposed areas of the photohardenable material and adhesive failure at the release sheet-photohardened interface, and (3) pressure transferring the underexposed image from the pressure release sheet to a receptor.

CROSS-REFERENCES TO RELATED APPLICATIONS

A photopolymerizable element useful in this invention consisting of a photopolymerizable composition on a base support, is disclosed in assignee's Celeste and Chu application, Ser. No. 684,945, filed Nov. 22, 1967.

BACKGROUND OF THE INVENTION

This invention relates to image reproduction processes that employ photopolymerizable material as the image reproducing medium. More particularly it relates to methods for dry transferring photopolymerizable images to receptor surfaces.

Various thermal transfer processes are known for reproducing a photographic image of photopolymerizable material. Burg and Cohen, U.S. 3,060,023; U.S. 3,060,024 and U.S. 3,060,025 describe a thermal transfer process wherein the photopolymerizable imaged areas are brought into intimate contact with a receptor surface, and by the application of heat and pressure said imaged areas are transferred to the receptor.

An obvious shortcoming of all photopolymer imaging processes that employ thermal transfer is that they allow for transfer only to those receptors which are not heat-sensitive. The support and receptor must be stable at the heating temperature used in those processes. At elevated transfer temperatures there is also the danger of image distortion. These problems which are inherent in prior art thermal transfer methods are reduced or eliminated in the present invention.

SUMMARY OF THE INVENTION

An object of this invention is to provide new and practical means for transferring photographic images from elements bearing photopolymerizable material. Another object is to provide such a method which allows for the transfer to a variety of surfaces—both regular and irregular and heat sensitive. Said method should also be simple, economical and dependable, giving satisfactory reproductions.

These objects are accomplished by employing a dry transfer technique for transferring photopolymerizable images, which comprises (1) imagewise exposing photohardenable material to actinic radiation sufficient to harden the exposed areas only, (2) transferring the underexposed areas to a transfer surface or sheet by applying pressure at a temperature at which there is cohesive failure of the underexposed areas of the photohardenable material and adhesive failure at the pressure transfer sheet-photohardened interface, and (3) applying pressure and transferring the underexposed image from the pressure transfer sheet to the surface of a receptor.

Since the final transfer is simply a pressure transfer at room temperature, the present invention overcomes some disadvantages inherent in thermal transfer processes. Thus there is little or no image distortion which means better registration for multilayer images. Also, almost any receptor, including those that are sensitive to heat, can be used. Another advantage is that there is no back transfer of photopolymer. Yet another advantage is that there is no need for postexposure between layers of multilayered images. Finally, staining by metallic toners is eliminated or greatly reduced since the stained areas no longer contact the previously transferred layers.

DESCRIPTION OF THE PREFERRED EMBODIMENTS

In practicing a preferred embodiment of the invention, a photopolymerizable element containing an image-yielding stratum is imagewise exposed to actinic radiation through a stencil or a process transparency, e.g., a positive, negative, two-tone or halftone, a light-transmitting paper, or to an image or printed matter on an opaque support by means of reflex exposure, pigment or other particles are applied to adhere only to the non-exposed areas, and the stratum is pressed into surface contact with a dry transfer, pressure release sheet, during which time the element is heated; and while still warm the surfaces are separated. The photopolymerizable composition is transferred to the pressure transfer sheet in those areas corresponding to the nonexposed areas of the element, and these imaged areas are transferred from the transfer sheet to a final receptor by pressure contact. This gives at least one duplicate copy of the original. Multiple copies are obtained by repeating the thermal transfer and pressure transfer with appropriate pressure, temperature and coating thickness for the photosensitive layer.

The dry transfer, pressure release sheet such as that described in U.S. 3,013,917, may be a paper base bearing a releasable chemical coating, the sheets of paper being chemically treated to facilitate release of the imaged areas adhering to the coating.

Chemicals for release coatings are well known, as is their application, as released coatings to paper and sheetings. Typical chemicals for release coatings which are satisfactory in the practice of the invention are the organosiloxanes and stearato-chromic chloride. Useful organosiloxanes are disclosed in U.S. 3,013,917.

Metal foil, such as aluminum foil, polyester, polyethylene, and polypropylene are also suitable as pressure release sheets. These materials do not need a chemical release coating to effect the transfer to a final receptor surface.

The exposed photopolymerizable layer, which in a preferred process is coated on a polyethylene terephthalate base prepared by the method of F. P. Alles, U.S. 2,779,684, Example IV, is laminated to the pressure release sheet by contacting the exposed composition with the release sheet while heat is simultaneously applied to effect the transfer of the underexposed areas of the photopolymerizable composition. The transfer temperature should be between the softening temperatures of the underexposed and exposed material. Heat can be applied by means well known in the art, e.g., rollers, flat or curved heating surfaces, radiant sources such as heating lamps, etc.

When stripping apart the sheets, the underexposed areas fail cohesively with a stratum adhering to the release sheet while there is adhesive failure at the release sheet-exposed photopolymer interface.

The underexposed areas can be transferred from the release sheet by placing the dry transfer, pressure release sheet, images facing down, upon a receptor surface, and rubbing the imaged areas. Almost any implement having a smooth surface is suitable for effecting the rubbing. Such methods as the bouncing ball and vibrating pin techniques can also be used. Such techniques and apparatus for applying the techniques are described in U.S. Pats. Nacci-Rego, 3,179,975, Apr. 27, 1969; Helpern-McNutt, 3,113,342, Dec. 10, 1963; and Halpern, 3,243,843 and 3,244,777, Apr. 5, 1966. The sheet should be prevented from moving while the rubbing process is being effected.

The terms "photopolymerizable" and "photohardenable" as used herein refer to systems in which the molecular weight of at least one component of the photosensitive layer is increased by exposure to actinic radiation sufficiently to result in a change in the rheological and thermal behavior of the exposed areas.

Among suitable photopolymerizable or photohardenable systems are: (1) those in which a photopolymerizable monomer is present alone or in combination with a compatible binder, or (2) those in which the photohardenable group, attached to a polymer backbone, becomes activated on exposure to light and may then crosslink by reacting with a similar group or other reactive sites on adjacent polymer chains. In the second group of suitable photohardenable systems, where the monomer or pendent photohardenable group is capable of addition polymerization, e.g., terminal ethylenically unsaturated groups, the photopolymerized chain length may include addition of many similar units initiated by a single photochemical act. Where only dimerization of compounds is involved, e.g., benzophenone or cinnamoyl compounds the average molecular weight of the photosensitive constituent can be at best only doubled by a single photochemical act. When a photopolymerizable molecule has more than one reaction site, a crosslinked network can be produced.

The term "underexposed" as used herein is intended to cover the image areas of the photohardenable layers which are completely unexposed or those exposed only to the extent that there is photohardenable compound still present in sufficient quantity that the molecular weight, and therefore the softening temperature, remains substantially lower than that of the complementary exposed image areas.

If either a simple monomer or monomer-polymer binder system is being used, the element in the preferred process contains a free radical generating addition polymerization initiator in the photopolymerizable layer. In addition, particularly where a photocrosslinkable polymer or dimer system is used the layer may also contain a plasticizing agent.

Suitable free radical initiated, chain-propagating addition polymerizable ethylenically unsaturated compounds for use in the simple monomer-polymer binder photopolymerizable layer are described in Burg et al., U.S. 3,060,023; Celeste et al., 3,261,686; and in assignee's Cohen and Schoenthaler, U.S. Application Ser. No. 370,338 filed May 26, 1964 now U.S. Pat. No. 3,380,831. Polymers for use in the monomer-polymer binder system and preferred free radical generating addition polymerization initiators are described in U.S. 3,060,023.

Photodimerizable materials useful in the invention are cinnamic acid esters of high molecular weight polyols, polymers having chalcone and benzophenone type groups, and others disclosed in Chapter 4 of "Light-Sensitive Systems" by J. Kosar published by John Wiley and Sons, Inc., N.Y., 1963. Photopolymerizable materials capable of photocrosslinking with more than one adjacent polymeric chain to form a network are described in assignee's U.S. application Ser. No. 451,300 by A. C. Schoenthaler, filed Aug. 27, 1965, now U.S. Pat. No. 3,418,295, and Ser. No. 477,016 by J. R. Celeste filed Aug. 3, 1965, first refiled as S.N. 759,217, on Sept. 11, 1968 now U.S. Pat. 3,469,982.

Preferred free radical generating addition polymerization initiators activatable by actinic radiation, e.g., ultraviolet and visible light are listed in U.S. 3,060,023 and the other patents referred to above.

Where the polymer is a hard, high-melting compound, a plasticizer is usually used to lower the glass transition temperature and facilitate cohesive failure in the underexposed areas. The plasticizer may be a monomer itself, e.g., a diacrylate ester, or any of the common plasticizers which are compatible with the polymeric binder. Suitable plasticizers are disclosed in assignee's Celeste and Chu U.S. application Ser. No. 684,945 filed Nov. 23, 1967.

The photohardenable layer thickness can vary according to its composition and the intended use. A preferred range is 0.0001" to 0.002", but with some polymeric binders much greater thicknesses can be used, especially where multiple transfers after the initial delamination are to be made.

Since free radical generating addition polymerization initiators activatable by actinic radiation generally exhibit their maximum sensitivity in the ultraviolet range, the light source for exposure should furnish an effective amount of this radiation. Such sources include carbon arcs, mercury-vapor arcs, fluorescent lamps with ultraviolet light-emitting phosphors, argon glow lamps, electronic flash units and photographic flood lamps.

Various dyes, pigments, thermographic compounds and color forming compounds may be applied to the photopolymerizable material before or after the imaged areas have been transferred to the pressure release sheet. A prepigmented photopolymerizable layer may also be used to impart color to the images. Colorants which may be incorporated directly into the photopolymer are disclosed in U.S. 3,060,026. Pigments are applied by a dusting treatment similar to that disclosed in U.S. 3,060,024.

If the photopolymerizable imaged areas, having been transferred to the pressure release sheet, have hardened before their transfer to a receptor surface—as a result of extensive delay before the final transfer or intentionally postexposing the images—a natural or synthetic wax may be coated over the imaged areas of the perssure transfer release sheet to afford an adhesive base for the transferred images. The wax may be applied in any well known fashion, e.g., by brushing, silk screening, roller coating or spraying. It is most desirable to use a clear wax, such as a microcrystalline wax, spermaceti wax or carnauba wax. Other suitable waxes include almost any animal, vegetable or mineral wax. Typical are petroleum waxes, paraffin waxes, paraffinic-naphthenic waxes, beeswax, castor wax and candelilla wax. The dry wax adhesive deposited forms an excellent bond with the photopolymerizable image.

Receptors suitable for receiving the transferred photopolymerizable image include both regular and irregular and heat sensitive surface. Such receptors include paper, glass, metal, synthetic polymers, screen, wood, cloth, foils and rubber. Transferring the underexposed material to a metal support, such as aluminum, followed by postexposure gives a photographic plate suitable for lithographic printing.

The invention will be further illustrated by, but is not intended to be limited to the following examples.

EXAMPLE I

The following solution was prepared:

| | Grams |
|---|---|
| Trichloroethylene | 400.0 |
| Methyl methacrylate polymer (density=1.13 g./cc.) | 100.0 |
| Trimethylolpropane trimethacrylate | 130.0 |
| 2-pyrrolidinone | 25.0 |
| 2-o-chlorophenyl-4,5-bis-(m-methoxyphenyl) imidazolyl dimer | 4.0 |
| 2-mercaptobenzothiazole | 0.4 |
| Optical brightener (a reaction product of cyanuric chloride with (a) 7 amino-3-phenyl coumarin and (b) diethylamine in which one chlorine of the cyanuric chloride is reacted with (a), one chlorine with (b), and one chlorine is unreacted) | 0.5 |
| Trichloroethylene | To 1,000.0 |

After stirring for 15 minutes at room temperature, the above solution was coated on a 0.004" thick, resin-subbed (F. P. Alles, U.S. 2,779,684 Example IV), polyethylene terephthalate base support.

The coating was dried at 55° C., and a 0.001" cover sheet of polyethylene terephthalate was laminated onto the coating at 50° C.

The photopolymerizable layer was exposed for 15 seconds through a lithographic high-contrast positive using a nuArc "Flip Top" Plate Maker, Model FT–26–L pulsed xenon light source. The polyethylene terephthalate cover sheet was removed at room temperature, and Jungle Black toner (C.I. Pigment Black 1) was applied to the photopolymer surface. The pigment adhered to only those areas that were not exposed to light.

The photopolymer layer was then laminated at 100° C. on a fixed-bed transfer machine (as described in U.S. Pat. 3,594,535, July 20, 1971) to a stearato-chromic chloride coated sheet of pressure release paper. Transfer was effected by cohesive failure of the unpolymerized material which adhered to the release sheet.

The photopolymerizable image on the release sheet was transferred to a sheet of "Kromekote" paper, manufactured by the Champion Paper and Fibre Company, by bringing the imaged areas into contact with the paper receptor and burnishing the back of the pressure release sheet.

EXAMPLE II

The following solution was prepared:

| | Grams |
|---|---|
| Trichloroethylene | 400.0 |
| Methyl methacrylate polymer (density=1.13 g./cc.) | 100.0 |
| Trimethylolpropane trimethacrylate | 140.0 |
| 2-pyrrolidinone | 25.0 |
| 2-o-chlorophenyl-4,5-bis-(m-methoxyphenyl) imidazolyl dimer | 4.0 |
| 2-mercaptobenzothiazole | 0.4 |
| Optical brightener (see Example I) | 0.5 |
| Trichloroethylene | To 1,000.0 |

The solution was stirred for 15 minutes at room temperature and coated on 0.004" thick resin-subbed polyethylene terephthalate base support.

The coating was dried at 55° C. and a cover sheet of 0.001" polyethylene terephthalate was laminated onto the coating at 50° C.

The photopolymerizable material was exposed for 15 seconds through a high contrast, halftone positive using the light source of Example I.

After removal of the cover sheet, Jungle Black toner (C.I. Pigment Black 1) was dusted onto the coating, adhering to the unpolymerized areas only. The underexposed, toned areas were then transferred to a sheet of paper bearing a coating of dimethyldichlorosiloxane by laminating the photopolymerizable layer to the release sheet at 95° C. using the pressure transfer machine of Example I.

The underexposed areas, transferred to the release sheet, were postexposed for one minute using an ultraviolet light source. The imaged areas were then overcoated with a paraffin wax (melting point=52° C.).

The photopolymer image was transferred to a glass surface by pressing the release sheet against the glass receptor.

EXAMPLE III

The following solution was prepared:

| | Grams |
|---|---|
| Trichloroethylene | 1,732.0 |
| Methyl methacrylate polymer (density=1.13 g./cc.) | 157.5 |
| 2-ethylanthraquinone | 5.25 |
| 2,2'-dihydroxy - 4-methoxybenzophenone | 4.4 |
| Polyoxyethylated trimethylol propane triacrylate (avg. mol wt.=1,000) | 175.0 |
| Polyoxyethylene monolauryl ether | 26.3 |

The above solution was stirred at room temperature for 10 minutes and coated on a 0.004" thick, resin subbed, polyethylene terephthalate base support.

After drying at 55° C., the coating was laminated with a 0.001" polyethylene terephthalate cover sheet at 50° C.

The photopolymerizable layer was then exposed through the cover sheet for 15 seconds through a high contrast halftone positive using the nuArc light source of Example I.

The cover sheet was removed and Monastral Blue Toner (C.I. Pigment Blue 15) was dusted onto the coating. After which, the underexposed areas of the coating were transferred to a stearato chromic chloride coated glassine pressure release sheet by laminating the photopolymerizable layer onto the release sheet at 100° C. using the pressure transfer machine of Example I.

Pressing the release sheet against a sheet of "Kromekote" paper resulted in the transfer of the imaged areas to the "Kromekote" receptor.

EXAMPLE IV

The following is an application of the present invention to the preparation of a photoresist.

A solution was prepared having the following composition:

| | Grams |
|---|---|
| Trichloroethylene | 400.0 |
| Methyl methacrylate polymer (density=1.13 g./cc.) | 100.0 |
| Polyoxyethylated trimethylol propane triacrylate (avg. mol wt.=1,000) | 115.0 |
| 2-o-chlorophenyl - 4,5 - bis - (m - methoxyphenyl) imidazolyl dimer | 8.0 |
| 2-mercaptobenzothiazole | 0.8 |
| Optical brightener (see Example I) | 0.8 |
| p-Toluenesulfonic acid | 2.5 |
| Tris-(p-diethylamino-o-tolyl) methane | 4.0 |
| Trichloroethylene | To 1,000.0 |

The solution was stirred for 15 minutes at room temperature and coated on 0.004" thick resin-subbed polyethylene terephthalate base support.

The coating was dried at 55° C. and a cover sheet of 0.001" polyethylene terephthalate was laminated onto the coating at 50° C.

Using the light source of Example I, the photopolymerizable layer was then exposed for 10 seconds through a high contrast halftone positive.

The underexposed areas were then transferred to a stearato-chromic chloride coated sheet of pressure release paper by lamination at 100° C. by the method of Example I.

Bringing the release sheet into intimate contact with a sheet of copper and applying pressure resulted in the transfer of the imaged areas to the copper receptor.

The photopolymerizable image was then postexposed for 30 seconds using an ultraviolet light source to give a blue-tinted positive image that was suitable for use as a photoresist for etching, soldering, etc., in a manner well known in the art.

It will be apparent from the foregoing description and examples that the force relationships at the temperatures during image transfer, as exemplified by a photopolymerizable stratum, are as follows:

I

| Adhesion | > | Cohesion | < | Adhesion | < | Adhesion |
|---|---|---|---|---|---|---|
| (Underexposed photopolymerizable material to initial support and receptor.) | | (Underexposed photopolymerizable material.) | | (Underexposed photopolymerizable material to pressure transfer sheet.) | | (Underexposed photopolymerizable material to receptor.) |

II

| Adhesion | > | Cohesion | > | Adhesion |
|---|---|---|---|---|
| (Exposed photopolymer to initial support.) | | (Exposed photopolymer.) | | (Exposed photopolymer to pressure transfer sheet.) |

In addition to the process applications described in the above referenced patents, the present process is useful in making package comprehensives, engineering reproductions, and map prints, and is suited to chemical milling and photolofting processes. The process is also useful in making printed circuits, metal decorating, map printing, silk screen stencils, decoration of glass and ceramics, and in many graphic arts procedures.

The embodiments of the invention in which an exclusive property or privilege is claimed are defined as follows:

1. An image-forming process which comprises, in order:

(1) exposing to actinic radiation, imagewise, a photohardenable stratum to harden the exposed areas only;

(2) transferring the underexposed areas of the stratum to a transfer surface by applying pressure sufficient to bring said stratum into intimate contact with said surface, at a temperature at which there is cohesive failure of the underexposed areas and adhesive failure of the exposed areas at the stratum-transfer surface interface; and (3) applying pressure and transferring underexposed image areas on the transfer surface to the surface of a receptor, said pressure being sufficient to bring the underexposed areas on the transfer surface into intimate contact with said receptor.

2. A process according to claim 1, where in step (1) the stratum is on a hydrophobic organic polymer film, and the transfer surface has a release coating.

3. A process according to claim 1 where in step (2) the stratum is on a hydrophobic, macromolecular organic polymer film, the transfer surface has a release coating, and the receptor is a sheet of paper.

4. A process according to claim 1, wherein said stratum is photopolymerizable and contains at least one non-gaseous, ethylenically unsaturated compound capable of forming a high polymer by addition polymerization.

5. A process according to claim 1, wherein said stratum is photopolymerizable and contains at least one non-gaseous, ethylenically unsaturated compound capable of forming a crosslinkable acrylic acid ester as an addition polymerizable component.

6. A process according to claim 1, wherein said stratum is photopolymerizable and contains a methyl methcrylate polymer and a trimethylolpropane trimethyl acrylate.

7. A process according to claim 1, wherein said stratum is photopolymerizable and contains a methyl methacrylate polymer and a polyoxyethylated trimethylolpropane triacrylate.

References Cited

UNITED STATES PATENTS

| | | | |
|---|---|---|---|
| 3,060,026 | 10/1962 | Heiart | 96—28 |
| 3,060,025 | 10/1962 | Burg et al. | 96—28 |
| 3,060,023 | 10/1962 | Burg et al. | 96—28 |
| 3,353,955 | 11/1967 | Colgrove | 96—28 |
| 3,615,435 | 10/1971 | Chu | 96—33.1 |

NORMAN G. TORCHIN, Primary Examiner

J. L. GOODROW, Assistant Examiner

U.S. Cl. X.R.

96—114